United States Patent

Tisinger et al.

[11] Patent Number: 5,079,453
[45] Date of Patent: Jan. 7, 1992

[54] SLOPE COMPENSATION CIRCUIT FOR STABILIZING CURRENT MODE CONVERTERS

[75] Inventors: Eric W. Tisinger, Chandler; Jade H. Alberkrack, Tempe, both of Ariz.

[73] Assignee: Motorola, Inc., Schaumburg, Ill.

[21] Appl. No.: 577,350

[22] Filed: Sep. 4, 1990

[51] Int. Cl.$^5$ .......................... H03K 4/08; H03K 4/84
[52] U.S. Cl. .................... 307/491; 307/228; 307/263; 307/260; 328/185; 328/181
[58] Field of Search ............. 307/491, 228, 263, 260, 307/517; 328/127, 185, 181, 183

[56] References Cited

U.S. PATENT DOCUMENTS

| | | | |
|---|---|---|---|
| 4,047,052 | 9/1977 | Koubek et al. | 307/228 |
| 4,705,961 | 11/1987 | Ainsworth et al. | 307/228 |
| 4,803,381 | 2/1989 | Gornati et al. | 307/263 |
| 5,008,562 | 4/1991 | Hosoda et al. | 307/263 |

Primary Examiner—Timothy P. Callahan
Attorney, Agent, or Firm—Bradley J. Botsch; Michael D. Bingham

[57] ABSTRACT

A control circuit having slope compensation includes a current reference circuit for providing a reference current at an output. A resistor is coupled to the current reference circuit for varying the reference current. A current mirror circuit has a plurality of outputs, and an input which is coupled to the output of current reference circuit for receiving the reference current. A capacitor is coupled between a first one of the plurality of outputs of the current mirror circuit and a first supply voltage terminal. A charging/discharging circuit is coupled to the capacitor and to a second one of the plurality of outputs of the current mirror circuit for charging the capacitor to a first predetermined voltage at a first rate and discharging the capacitor to a second predetermined voltage at a second rate wherein the signal appearing across the capacitor is a ramp voltage signal. A level shift circuit is coupled to the first one of the plurality of outputs of the current mirror circuit for voltage shifting the ramp voltage signal across the capacitor by a predetermined amount. A multiplier circuit is coupled to the level shift circuit and responsive to the reference current supplied from a third one of the plurality of outputs of the current mirror circuit for providing a ramp current signal at an output, the peak voltage of the ramp current signal being a function of the value of the resistor wherein the ramp current signal at the output of the multiplier circuit can be utilized to provide slope compensation to a signal supplied at an input of the control circuit.

12 Claims, 1 Drawing Sheet

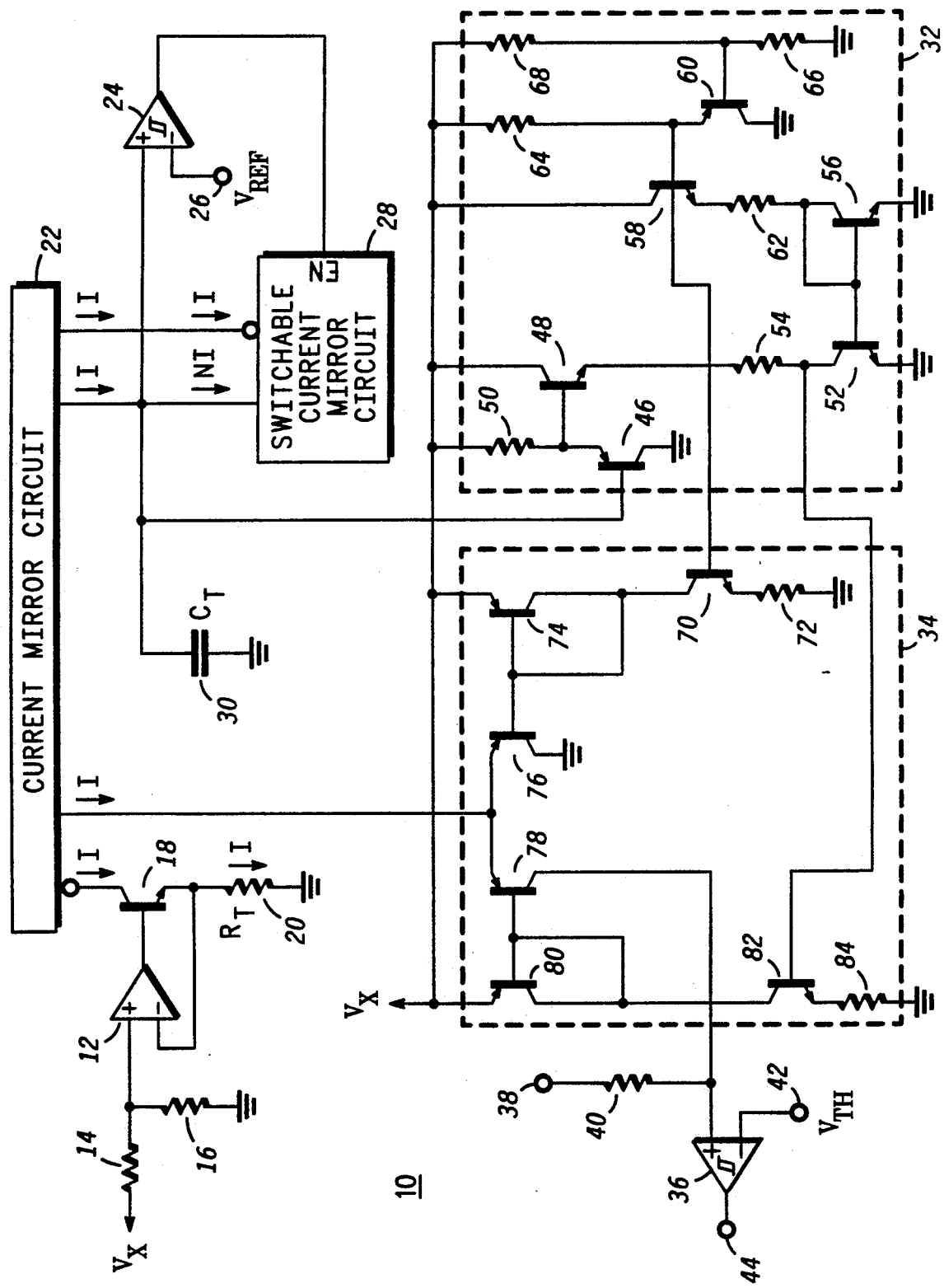

SLOPE COMPENSATION CIRCUIT FOR STABILIZING CURRENT MODE CONVERTERS

BACKGROUND OF THE INVENTION

This invention relates to control circuits and, in particular, to providing a ramp signal for slope compensating a control circuit.

A slope compensator is typically used to generate a voltage ramp waveform in order to stabilize a current mode switching regulator. Further, most, if not all, current mode regulators that operate above a 50% duty cycle require slope compensation to prevent subharmonic oscillation, as is known. A slope compensator operates by adding a linear ramp signal to a current feedback ramp signal. Typically, this is accomplished by creating an offset voltage at one input of a pulse width modulator (PWM) comparator. The offset voltage typically starts at 0 volts at the beginning of a clock cycle and linearly ramps up to a predetermined voltage during the on-time of the clock. However, the function of the slope compensator is typically not included within a chip of an integrated control circuit. Thus, users must add this function externally by using discrete circuitry.

Micro Linear manufactures some integrated circuits which include slope compensation within the integrated circuit itself. Some examples are: ML4809, ML4810, ML4811 and ML4812. However, these integrated circuits simply provide a level shift and buffer circuit similar to methods that use external discrete circuits. Further, these integrated circuits also require a dedicated programming pin for slope compensation.

Hence, a need exists for an improved integrated control circuit having slope compensation while not requiring the use of a dedicated pin.

SUMMARY OF THE INVENTION

Accordingly, it is an object of the present invention to provide an improved control circuit.

Another object of the present invention is to provide an improved control circuit which is suitable for manufacture within an integrated circuit.

Yet another object of the present invention is to provide an improved control circuit having slope compensation.

Still another object of the present invention is to provide an improved control circuit which does not require a dedicated pin to perform slope compensation.

Still even another object of the present invention is to generate a reference current by an external resistor that provides a ramp current which is utilized for slope compensation.

In carrying out the above and other objects of the present invention, there is provided a circuit comprising a current reference circuit for providing a reference current at an output; a resistor coupled to the current reference circuit for varying the reference current; a current mirror circuit having a plurality of outputs, and an input coupled to the output of the current reference circuit; a capacitor coupled between a first one of the plurality of outputs of the current mirror circuit and a first supply voltage terminal; a charging and discharging circuit coupled to the capacitor and to a second one of the plurality of outputs of the current mirror circuit for charging the capacitor to a first predetermined voltage at a first rate and discharging the capacitor to a second predetermined voltage at a second rate wherein the signal appearing across the capacitor is a ramp voltage signal; a level shift circuit coupled to the first one of the plurality of outputs of the current mirror circuit for voltage shifting the ramp voltage signal across the capacitor by a predetermined amount; and a multiplier circuit coupled to the level shift circuit and responsive to the reference current supplied from a third one of the plurality of outputs of the current mirror circuit for providing a ramp current signal at an output of the circuit, the ramp current signal being a function of the value of the resistor.

The above and other objects, features and advantages of the present invention will be better understood from the following detailed description taken in conjunction with the accompanying drawing.

BRIEF DESCRIPTION OF THE DRAWING

The sole FIGURE is a partial schematic diagram illustrating a circuit for providing a ramp signal for accomplishing slope compensation.

DETAILED DESCRIPTION OF THE INVENTION

Referring to the sole FIGURE, a partial schematic diagram illustrating circuit 10, suitable for manufacture on an integrated circuit, which provides a ramp signal to accomplish slope compensation is shown comprising operational amplifier (op amp) 12 having a first input coupled by resistor 14 to a first supply voltage terminal at which the operating potential $V_X$ is applied. Further, the first input of op amp 12 is returned to ground by resistor 16. The second input of op amp 12 is coupled to the emitter of transistor 18 and returned to ground reference by resistor 20. The base of transistor 18 is coupled to the output of op amp 12 while the collector of transistor 18 is coupled to the input of current mirror circuit 22 whereby current mirror circuit 22 provides a plurality of outputs. Comparator circuit 24 has a first input coupled to a first output of current mirror circuit 22 and a second input coupled to terminal 26 at which reference voltage $V_{REF}$ is supplied. The output of comparator circuit 24 is coupled to a control input of switchable current mirror circuit 28, the latter having an input coupled to a second output of current mirror circuit 22. The first output of current mirror circuit 22 is further coupled to ground reference by capacitor 30, to an output of switchable current mirror 28, and to an input of level shift circuit 32. Level shift circuit 32 is coupled to multiplier circuit 34. Multiplier circuit 34 is also coupled to a third output of current mirror circuit 22 and has an output coupled to a first terminal of comparator circuit 36. The first input of comparator circuit 36 is further coupled to terminal 38 by resistor 40, while the second input of comparator circuit 36 is coupled to terminal 42 at which reference voltage $V_{TH}$ is supplied. Also, the output of comparator circuit 36 is coupled to terminal 44.

Level shift circuit 32 includes transistor 46 having a base coupled to the input of level shift circuit 32 and a collector returned to ground reference. The emitter of transistor 46 is coupled to the base of transistor 48 and to operating potential $V_X$ by resistor 50. The collector of transistor 48 is coupled to operating potential $V_X$ while the emitter of transistor 48 is coupled to the collector of transistor 52 by resistor 54. The base of transistor 52 is coupled to the base and collector of transistor 56 while the emitters of both transistors 52 and 56 are returned to ground. Transistor 58 has a collector coupled to operating potential $V_X$, while the base of transistor 58 is coupled to the emitter of transistor 60. Further, transistor 58 has an emitter coupled to the collector of transistor 56 by resistor 62. The collector of transistor 60 is coupled to ground reference while the emitter of transistor 60 is further coupled to operating potential $V_X$ by resistor 64. The base of transistor 60 is returned to ground by resistor 66 and coupled to operating potential $V_X$ by resistor 68.

Multiplier circuit 34 includes transistor 70 having its base coupled to the base of transistor 58 of level shift circuit 32, and an emitter returned to ground by resistor 72. The collector of transistor 70 is coupled to the base and collector of transistor 74 and to the base of transistor 76. The emitter of transistor 74 is coupled to operating potential $V_X$ while the collector of transistor 76 is returned to ground. The emitter of transistor 76 is coupled to the third output of current mirror circuit 22 and to the emitter of transistor 78. The base of transistor 78 is coupled to the base and collector of transistor 80 and also to the collector of transistor 82. The emitter of transistor 80 is coupled to operating potential $V_X$ while the collector of transistor 78 is coupled to the first input of comparator circuit 36. The base of transistor 82 is coupled to the collector of transistor 52 of level shift circuit 32 while the emitter of transistor 82 is returned to ground by resistor 84.

In operation, a voltage is generated at the first input of op amp 12 by operating potential $V_X$ via the resistor divider network of resistors 14 and 16. The voltage at the second input of op amp 12 will substantially equal the voltage at the first input of op amp 12 as is understood. This will provide a fixed predetermined voltage across resistor 20 ($R_T$) whereby resistor 20 can be chosen to provide a predetermined current, denoted by I, through transistor 18 and also to the input of current mirror circuit 22. The first output of current mirror circuit 22 supplies a current substantially equal to the current I to charge up capacitor 30 ($C_T$). Once the voltage across capacitor 30 exceeds reference voltage $V_{REF}$, comparator circuit 24 switches to a first logic state thereby enabling switchable current mirror circuit 28. Switchable current mirror circuit 28 has an input coupled to the second output of current mirror circuit 22 for sinking a current substantially equal to the current I, while the output of switchable current mirror circuit 28 draws a current of N times I (N*I) where N is typically greater than one, for example 20. It should be noted that switchable current mirror circuit 28 typically has gain associated therewith, whereby one example of achieving gain from switchable current mirror circuit 28 would be to choose a resistor value in the emitter leg of the input transistor that receives the current I to be N times the value of the resistor in the emitter leg of the output transistor. Also, another example would be to choose the area ratio of two transistors to be N to 1. Thus, the current flowing through the output of switchable current mirror circuit 28 is substantially N times the current flowing through the input of switchable current mirror circuit 28. This essentially allows capacitor 30 to be discharged at a rate of (N-1) times the rate that it is charged. Similarly, as capacitor 30 discharges to a predetermined level, comparator circuit 24 switches to a second logic state and disables switchable current mirror circuit 28 thereby allowing current I to again charge capacitor 30. It is worth noting the comparator circuit 24 typically has a predetermined amount of hysteresis associated therewith such that comparator circuit 24 switches, for example to a logic high, when the voltage across capacitor 30 is charging and exceeds the voltage applied at terminal 26 ($V_{REF}$). However, comparator circuit 24 switches, for example to a logic low, when the voltage across capacitor 30 is discharging and falls below voltage $V_{REF}$ minus a predetermined hysteresis voltage $V_{HYS}$. In addition, it is very important to realized that a ramp signal is generated at the first input of comparator circuit 24 that initially starts at a voltage substantially equal to ($V_{REF} - V_{HYS}$), for example 1.1 volts, and ramps up to a voltage substantially equal to $V_{REF}$, for example 2.8 volts. This aforedescribed ramp signal also occurs at the emitter of transistor 48 via the buffer circuit comprised of transistors 46 and 48.

Level shift circuit 32 operates to level shift the ramp signal occurring at the first input of comparator circuit 24 to ramp from an initial voltage of 0 volts up to a final voltage of $V_{HYS}$ (1.7 volts). Therefore, level shift circuit 32 shifts the ramp signal appearing at the first output of current mirror circuit 22 by the voltage ($V_{REF} - V_{HYS}$), or for the above example 1.1 volts. This is accomplished by first generating a predetermined voltage that is substantially equal to the voltage ($V_{REF} - V_{HYS}$) at the base of transistor 60 via operating potential $V_X$ and the resistor divider network comprised of resistors 66 and 68. The voltage at the base of transistor 60 is then buffered through transistor 60 and 58 such that the voltage occurring at the emitter of transistor 58 is substantially equal to the voltage at the base of transistor 60. Therefore, a predetermined voltage appears across resistor 62 and diode connected transistor 56 which consequently defines a predetermined current flowing through transistors 56 and resistor 62. Further, since transistors 52 and 56 form a current mirror, the collector current of transistor 52 is substantially equal to the predetermined current through transistor 56 and resistor 62. It is important to realize that the voltage at the collector of transistor 52 can swing up or down without varying the collector current of transistor 52 since the collector current is fixed by the current mirror. This implies that the voltage drop across resistor 54 is substantially equal to the voltage drop across resistor 62 which essentially means that the voltage drop across resistor 54 plus a base-emitter voltage drop ($V_{BE}$) is substantially equal to the desired voltage shift of ($V_{REF} - V_{HYS}$). Or equivalently, the voltage occurring at the emitter of transistor 82 of multiplier circuit 34 is substantially equal to the voltage occurring at the emitter of transistor 48 ($V_{REF} - V_{HYS}$). Therefore, since a ramp signal is present at the emitter of transistor 48, a ramp signal will also be present at the emitter of transistor 82 which is substantially level shifted by voltage ($V_{REF} - V_{HYS}$). It should be realized now that the signal appearing at the emitter of transistor 82 is a ramp voltage signal starting at an initial value of 0 volts and ramping up to a voltage of $V_{HYS}$. Furthermore, it should also be realized that the collector current through transistor 82 and through transistor 80 is a ramp current that starts off at 0 Amps and ramps up to a peak value of ($V_{HYS}/R_{84}$) Amps.

Turning our attention to transistor 70, the voltage at the emitter thereof is substantially equal to the voltage at the base of transistor 60 which is fixed by the resistor divider network of resistors 66 and 68. Therefore, transistor 70 and resistor 72 determine the reference current for multiplier circuit 34. Also, it is worth noting that resistors 84 and 72 are chosen such that when the voltage at the emitter of transistor 82 is at its peak voltage, $V_{HYS}$, the collector current through transistor 82 is substantially equal to the collector current through transistor 70. Therefore, when transistors 74 and 80 are operating at a substantially the same current, the voltage at the bases of transistors 76 and 78 are substantially equal and, thus, the current through transistors 76 and 78 are substantially equal. At this condition, substantially half of the current (I/2) provided by the third output of current mirror circuit 22 flows through transistor 76 while the other half flows through transistor 78. Likewise, if no current is flowing through transistor 82 and transistor 80, substantially all of the current (I) from the third output of current mirror circuit 22 will flow through transistor 76 and substantially zero current will flow through transistor 78. Therefore if one looks at how the current through transistor 78 varies as the voltage at the emitter of transistor 82 varies, the current through the emitter of transistor 78 is a ramp current that initially starts off at 0 Amps and ramps up to a peak current of I/2. It is important to realize that the peak current flowing through transistor 78 is adjustable simply by adjusting the value of resistor 20 which initially determined the current flowing through the input of current mirror circuit 22.

This ramp current is then supplied to the first input of comparator circuit 36 and is converted to a voltage ramp by resistor 40. This voltage ramp signal is then superimposed on the signal that is applied at terminal 38 thereby accomplishing slope compensation. The signal applied at terminal 38 is typically a voltage signal that is proportional to a current that is desired to be regulated by circuit 10. Output terminal 44 is typically coupled to an output of an integrated control circuit by a latch (not shown). It must be noted that resistor 20 ($R_T$) and capacitor 30 ($C_T$) are respectively the timing resistor and the timing capacitor that are used to set the duty cycle and frequency parameters of an oscillator circuit which is typically included in the integrated circuit containing circuit 10. Therefore, by utilizing resistor 20 to provide a variable peak ramp current through transistor 78, slope compensation for the signal applied at terminal 38 is achieved while not requiring the use an additional pin.

By now it should be apparent from the foregoing discussion that a novel control circuit has been provided having slope compensation while not requiring a dedicated pin.

What is claimed is:

1. A circuit, comprising:
   current reference means for providing a reference current at an output;
   a current mirror circuit having a plurality of outputs, and an input coupled to said output of said current reference means;
   a capacitor having first and second terminals, said first terminal of said capacitor being coupled to a first one of said plurality of outputs of said current mirror circuit, said second terminal of said capacitor being coupled to a first supply voltage terminal;
   means coupled to said first terminal of said capacitor and to a second one of said plurality of outputs of said current mirror circuit for charging said capacitor to a first predetermined voltage at a first rate and discharging said capacitor to a second predetermined voltage at a second rate wherein a signal appearing at said first terminal of said capacitor is a ramp voltage signal;
   a level shift circuit having an input and an output, said input of said level shift circuit being coupled to said first one of said plurality of outputs of said current mirror circuit, said output of said level shift circuit providing a voltage level shifted version of said ramp voltage signal appearing across said capacitor; and
   a multiplier circuit having an input coupled to said output of said level shift circuit and being responsive to a current supplied from a third one of said plurality of outputs of said current mirror circuit for providing a ramp current signal at an output of the circuit.

2. The circuit according to claim 1 wherein said multiplier circuit includes:
   a first transistor having a collector, a base and an emitter, said base of said first transistor being responsive to a voltage appearing in said level shift circuit;
   a second transistor having a collector, a base and an emitter, said base of said second transistor being coupled to said output of said level shift circuit;
   a third transistor having a collector, a base, and an emitter, said collector and base of said third transistor being coupled to said collector of said first transistor, and said emitter of said third transistor being coupled to a second supply voltage terminal;
   a fourth transistor having a collector, a base and an emitter, said collector and base of said fourth transistor being coupled to said collector of said second transistor, and said emitter of said fourth transistor being coupled to said second supply voltage terminal;
   a fifth transistor having a collector, a base and an emitter, said collector of said fifth transistor being coupled to said first supply voltage terminal, said base of said fifth transistor being coupled to said base of said third transistor, and said emitter of said fifth transistor being coupled to said third one of said plurality of outputs of said current mirror circuit;
   a sixth transistor having a collector, a base and an emitter, said collector of said sixth transistor being coupled to said output of the circuit, said base of said sixth transistor being coupled to said base of said fourth transistor, and said emitter of said sixth transistor being coupled to said emitter of said fifth transistor;
   a first resistor being coupled between said emitter of said first transistor and said first supply voltage terminal; and
   a second resistor being coupled between said emitter of said second transistor and said first supply voltage terminal.

3. The circuit according to claim 2 wherein said level shift circuit includes:
   a first transistor having a collector, a base and an emitter, said collector of said first transistor of said level shift circuit being coupled to said first supply voltage terminal, said base of said first transistor of said level shift circuit being coupled to said first one of said plurality of outputs of said current mirror circuit;
   a second transistor having a collector, a base and an emitter, said collector of said second transistor of said level shift circuit being coupled to said second supply voltage terminal, and said base of said second transistor of said level shift circuit being coupled to said emitter of said first transistor of said level shift circuit;

a third transistor having a collector, a base and an emitter, said collector of said third transistor of said level shift circuit being coupled to said base of said second transistor of said multiplier circuit, and said emitter of said third transistor of said level shift circuit being coupled to said first supply voltage terminal;

a fourth transistor having a collector, a base and an emitter, said collector and base of said fourth transistor of said level shift circuit being coupled to said base of said third transistor of said level shift circuit, and said emitter of said fourth transistor of said level shift circuit being coupled to said first supply voltage terminal;

a fifth transistor having a collector, a base and an emitter, said collector of said fifth transistor of said level shift circuit being coupled to said second supply voltage terminal, said base of said fifth transistor of said level shift circuit being coupled to said base of said first transistor of said multiplier circuit;

a sixth transistor having a collector, a base and an emitter, said collector of said sixth transistor of said level shift circuit being coupled to said first supply voltage terminal, said emitter of said sixth transistor of said level shift circuit being coupled to said base of said fifth transistor of said level shift circuit;

a first resistor coupled between said emitter of said first transistor of said level shift circuit and said second supply voltage terminal;

a second resistor coupled between said emitter of said second transistor of said level shift circuit and said collector of said third transistor of said level shift circuit;

a third resistor coupled between said collector of said fourth transistor of said level shift circuit and said emitter of said fifth transistor of said level shift circuit;

a fourth resistor coupled between said base of said sixth transistor of said level shift circuit and said first supply voltage terminal;

a fifth resistor coupled between said base of said sixth transistor of said level shift circuit and said second supply voltage terminal; and a sixth resistor coupled between said emitter of said sixth transistor of said level shift circuit and said second supply voltage terminal.

4. The circuit according to claim 3 wherein said means includes:

a comparator circuit having first and second inputs and an output, said first input being coupled to said first one of said plurality of said outputs of said current mirror circuit, and said second input being coupled to a terminal at which a reference voltage is supplied; and a switchable current mirror circuit having an input, a control input and an output, said input of said switchable current mirror circuit being coupled to said second one of said plurality of outputs of said current mirror circuit, said output of said switchable current mirror circuit being coupled to said first one of said plurality of outputs of said current mirror circuit, and said control input of said switchable current mirror circuit being coupled to said output of said comparator circuit, said switchable current mirror circuit being enabled when said voltage appearing across said capacitor exceeds said reference voltage.

5. The circuit according to claims 3 or 4 wherein said current reference means includes:

an operational amplifier having first and second inputs and an output;

a transistor having a collector, a base and an emitter, said collector of said transistor of said current reference means being coupled to said input of said current mirror circuit, said base of said transistor of said current reference means being coupled to said output of said operational amplifier, and said emitter of said transistor of said current reference means being coupled to said second input of said operational amplifier;

a first resistor coupled between said first input of said operational amplifier and said second supply voltage terminal;

a second resistor coupled between said first input of said operational amplifier and said first supply voltage terminal; and a third resistor coupled between said second input of said operational amplifier and said first supply voltage terminal wherein the value of said third resistor determines the value of said reference current supplied to said input of said current mirror circuit.

6. In an integrated circuit, a control circuit, comprising:

current reference means for providing a reference current at an output;

a current mirror circuit having a plurality of outputs, and an input coupled to said output of said current reference means;

a capacitor having first and second terminals, said first terminal of said capacitor being coupled to a first one of said plurality of outputs of said current mirror circuit, said second terminal of said capacitor being coupled to a first supply voltage terminal;

means coupled to said first terminal of said capacitor and to a second one of said plurality of outputs of said current mirror circuit for charging said capacitor to a first predetermined voltage at a first rate and discharging said capacitor to a second predetermined voltage at a second rate wherein a signal appearing at said first terminal of said capacitor is a ramp voltage signal;

a level shift circuit having an input and an output, said input of said level shift circuit being coupled to said first one of said plurality of outputs of said current mirror circuit, said output of said level shift circuit providing a voltage level shifted version of said ramp voltage signal appearing across said capacitor;

a multiplier circuit having an input coupled to said output of said level shift circuit and being responsive to a current supplied from a third one of said plurality of outputs of said current mirror circuit for providing a ramp current signal at an output;

a comparator circuit having first and second inputs and an output, said first input of said comparator circuit being coupled to said output of said multiplier circuit, said second input of said comparator circuit being coupled to a first terminal of the control circuit, and said output of said comparator circuit being coupled to an output terminal of the control circuit; and an offset resistor coupled between a second terminal of said comparator circuit and a first input of said comparator circuit, said offset resistor converting said ramp current signal appearing at said output of said multiplier circuit to a voltage ramp signal for slope compensating a signal supplied at said first terminal of the control circuit.

7. The circuit according to claim 6 wherein said mulitiplier circuit includes:
- a first transistor having a collector, a base and an emitter, said base of said first transistor being responsive to a voltage appearing in said level shift circuit;
- a second transistor having a collector, a base and an emitter, said base of said second transistor being coupled to said output of said level shift circuit;
- a third transistor having a collector, a base, and an emitter, said collector and base of said third transistor being coupled to said collector of said first transistor, and said emitter of said third transistor being coupled to a second supply voltage terminal;
- a fourth transistor having a collector, a base and an emitter, said collector and base of said fourth transistor being coupled to said collector of said second transistor, and said emitter of said fourth transistor being coupled to said second supply voltage terminal;
- a fifth transistor having a collector, a base and an emitter, said collector of said fifth transistor being coupled to said first supply voltage terminal, said base of said fifth transistor being coupled to said base of said third transistor, and said emitter of said fifth transistor being coupled to said third one of said plurality of outputs of said current mirror circuit;
- a sixth transistor having a collector, a base and an emitter, said collector of said sixth transistor being coupled to said output of said multiplier circuit, said base of said sixth transistor being coupled to said base of said fourth transistor, and said emitter of said sixth transistor being coupled to said emitter of said fifth transistor;
- a first resistor being coupled between said emitter of said first transistor and said first supply voltage terminal; and
- a second resistor being coupled between said emitter of said second transistor and said first supply voltage terminal.

8. The circuit according to claim 7 wherein said level shift circuit includes:
- a first transistor having a collector, a base and an emitter, said collector of said first transistor of said level shift circuit being coupled to said first supply voltage terminal, said base of said first transistor of said level shift circuit being coupled to said first one of said plurality of outputs of said current mirror circuit;
- a second transistor having a collector, a base and an emitter, said collector of said second transistor of said level shift circuit being coupled to said second supply voltage terminal, and said base of said second transistor of said level shift circuit being coupled to said emitter of said first transistor of said level shift circuit;
- a third transistor having a collector, a base and an emitter, said collector of said third transistor of said level shift circuit being coupled to said base of said second transistor of said multiplier circuit, and said emitter of said third transistor of said level shift circuit being coupled to said first supply voltage terminal;
- a fourth transistor having a collector, a base and an emitter, said collector and base of said fourth transistor of said level shift circuit being coupled to said base of said third trasistor of said level shift circuit, and said emitter of said fourth transistor of said level shift circuit being coupled to said first supply voltage terminal;
- a fifth transistor having a collector, a base and an emitter, said collector of said fifth transistor of said level shift circuit being coupled to said second supply voltage terminal, said base of said fifth transistor of said level shift circuit being coupled to said base of said first transistor of said multiplier circuit;
- a sixth transistor having a collector, a base and an emitter, said collector of said sixth transistor of said level shift circuit being coupled to said first supply voltage terminal, said emitter of said sixth transistor of said level shift circuit being coupled to said base of said fifth transistor of said level shift circuit;
- a first resistor coupled between said emitter of said first transistor of said level shift circuit and said second supply voltage terminal;
- a second resistor coupled between said emitter of said second transistor of said level shift circuit and said collector of said third transistor of said level shift circuit;
- a third resistor coupled between said collector of said fourth transistor of said level shift circuit and said emitter of said fifth transistor of said level shift circuit;
- a fourth resistor coupled between said base of said sixth transistor of said level shift circuit and said first supply voltage terminal;
- a fifth resistor coupled between said base of said sixth transistor of said level shift circuit and said second supply voltage terminal; and
- a sixth resistor coupled between said emitter of said sixth transistor of said level shift circuit and said second supply voltage terminal.

9. The circuit according to claim 8 wherein said means includes:
- a comparator circuit having first and second inputs and an output, said first input being coupled to said first one of said plurality of said outputs of said current mirror circuit, and said second input being coupled to a terminal at which a reference voltage is supplied; and
- a switchable current mirror circuit having an input, a control input and an output, said input of said switchable current mirror circuit being coupled to said second one of said plurality of outputs of said current mirror circuit, said output of said switchable current mirror circuit being coupled to said first one of said plurality of outputs of said current mirror circuit, and said control input of said switchable current mirror circuit being coupled to said output of said comparator circuit, said switchable current mirror circuit being enabled when said voltage appearing across said capacitor exceeds said reference voltage.

10. The circuit according to claims 8 or 9 wherein said current reference means includes:
- an operational amplifier having first and second inputs and an output;
- a transistor having a collector, a base and an emitter, said collector of said transistor of said current reference means being coupled to said input of said current mirror circuit, said base of said transistor of said current reference means being coupled to said output of said operational amplifier, and said emitter of said transistor of said current reference means being coupled to said second input of said operational amplifier;

a first resistor coupled between said first input of said operational amplifier and said second supply voltage terminal;

a second resistor coupled between said first input of said operational amplifier and said first supply voltage terminal; and a third resistor coupled between said second input of said operational amplifier and said first supply voltage terminal wherein the value of said third resistor determines the value of said reference current supplied to said input of said current mirror circuit.

11. A method for providing a current ramp signal, the method comprising the steps of:

generating a reference current;

generating a voltage ramp signal across a capacitor by charging said capacitor to a first predetermined voltage at a first rate and discharging said capacitor to a second predetermined voltage at a second rate, said first and second rates being a function of the value of said reference current;

level shifting said voltage ramp signal appearing across said capacitor by a predetermined voltage; and converting said level shifted voltage ramp signal to the current ramp signal.

12. The method according to claim 11 further comprising the step of:

superimposing the current ramp signal on an additional signal to slope compensate said additional signal.

* * * * *